United States Patent [19]

Gracia et al.

[11] 4,414,315

[45] Nov. 8, 1983

[54] PROCESS FOR MAKING LITHOGRAPHIC PRINTING PLATE

[75] Inventors: Robert F. Gracia, Scituate, Mass.; Howard A. Fromson, 15 Rogues Ridge Rd., Weston, Conn. 06880

[73] Assignee: Howard A. Fromson, Weston, Conn.

[21] Appl. No.: 274,342

[22] Filed: Jun. 17, 1981

Related U.S. Application Data

[63] Continuation-in-part of Ser. No. 64,322, Aug. 6, 1979, abandoned.

[51] Int. Cl.$^3$ ............................ G03F 7/20; G03F 7/08
[52] U.S. Cl. ..................................... 430/302; 430/146; 430/175; 430/300; 430/309; 430/331; 101/455; 101/456; 101/459
[58] Field of Search ............... 430/302, 309, 331, 175, 430/146, 14, 17, 300; 101/455, 456, 459

[56] References Cited

U.S. PATENT DOCUMENTS

| | | | |
|---|---|---|---|
| 2,714,066 | 7/1955 | Jewett et al. | 430/175 |
| 3,091,533 | 5/1963 | Hodgins | 430/331 |
| 3,181,461 | 5/1965 | Fromson | 430/278 |
| 3,300,309 | 1/1967 | Chu | 430/175 |
| 3,669,660 | 6/1972 | Golda et al. | 430/331 |
| 3,679,419 | 7/1972 | Gillich | 430/175 |
| 3,751,257 | 8/1973 | Dahlman | 430/175 |
| 3,849,392 | 11/1974 | Steppan | 430/175 |
| 3,867,147 | 2/1975 | Teuscher | 430/175 |
| 4,186,006 | 1/1980 | Kobayashi et al. | 430/331 |
| 4,248,959 | 2/1981 | Jeffers et al. | 430/175 |

FOREIGN PATENT DOCUMENTS 548282  11/1957  Canada .............................. 430/309

*Primary Examiner*—Charles L. Bowers, Jr.
*Attorney, Agent, or Firm*—Felfe & Lynch

[57] ABSTRACT

Process for making a lithographic printing plate having an oleophilic amplified image prepared by (a) providing a silicated aluminum substrate with a hydrophilic, anionic, negatively charged surface and a layer on said surface of a light sensitive, cationic, positively charged, water soluble diazonium material having at least two reactive sites per molecule, each reactive site being capable of being chemically altered by actinic light or chemically reacted with an anionic material;

(b) selectively and incompletely exposing the diazo layer to actinic light to alter only a portion of the reactive sites thereby adhering the diazo material to the substrate in the exposed areas;

(c) coupling the diazo layer with an anionic material to reinforce diazo in the exposed areas in situ and remove diazo from the unexposed areas by contacting the substrate after exposure with an anionic material in water in a quantity and for a time sufficient to couple the anionic material with the diazo and dissolve the coupled product from the unexposed areas; and (d) rinsing with water to provide a printing plate having a reinforced, oleophilic image and a clean, hydrophilic background.

10 Claims, No Drawings

PROCESS FOR MAKING LITHOGRAPHIC PRINTING PLATE

RELATED APPLICATIONS

This application is a continuation-in-part of co-pending application Ser. No. 64,322 filed Aug. 6, 1979, now abandoned.

BACKGROUND

This invention relates to improved aluminum lithographic printing plates and to a process for making such plates.

Lithographic printing techniques, using, for example, silicated aluminum plates as described in Jewett et al. U.S. Pat. No. 2,714,066, or anodized and silicated aluminum plates as described in Fromson U.S. Pat. No. 3,181,461, are widely used in the printing industry.

A negative working plate is coated with an aqueous solution of a diazo resin, dried and normally exposed through a negative for 1 to 2 minutes. The exposed image areas become water insoluble and the unexposed non-image areas remain water soluble. The plate is conventionally developed with a lithographic lacquer which consists of a two-phase system, one phase containing a hydrophilic gum in water and the other an oleophilic resin in a solvent. Upon application, the oleophilic resin adheres to the exposed insoluble areas, while the water in the aqueous phase dissolves away the unexposed soluble non-image areas leaving a deposit of gum in the same areas. In this way, the image areas are made oleophilic or ink receptive and the gummed, non-image areas are made hydrophilic or ink repellent.

Silicated aluminum plates and silicated anodized aluminum plates (which can be pretreated to produce a grained surface) have been found to have a negatively charged surface which forms an ionic bond with a diazo resin which has an opposite, positive charge. While the unexposed, non-image portions of the diazo coating in theory remain water soluble, in practice it has been found that the dissolving power of water is insufficient to overcome the ionic bond. Thus, residual diazo remains in the non-image areas and the art has employed gum arabic to mask the residual diazo, which remains oleophilic, to prevent scumming or ink pick-up in the non-image areas (also referred to as the background).

The presence of residual diazol in the background can be demonstrated by exposing a diazo coated silicated aluminum plate thru a negative, developing it with water and then re-exposing the plate thru the same negative turned ninety degrees. The twice exposed plate is again developed with water and then rubbed with press ink. The first image appears as well as a second, crossed image in the background of the first image. Ionically bonded diazo that remains in the background is responsible and, unless masked with gum arabic, will result in undesirable ink pick-up in the background long before the image wears.

The use of stronger solvents such as benzyl alcohol with water or alone has been proposed as well as coupling diazo resins with various materials to make them sparingly soluble in water and soluble in organic solvents (cf. U.S. Pat. No. 3,300,309 and 3,790,556). However, solvents are expensive and present serious disposal problems. The art has long sought a truly water-developable plate.

It has also been proposd to alter the surface characteristics of the aluminum plate to minimize or prevent ionic bonding by the diazo resin (cf. U.S. Pat. No. 3,220,832) but this has drawbacks with respect to adhesion in the image areas.

While there are suggestions for using wetting agents in lithographic developers and lacquers, the art has avoided the use of anionic surfactants in diazo developers because it is known that a chemical reaction takes place (cf. U.S. Pat. No. 3,790,556) between a diazo and an anionic surfactant. The ink-loving reaction product is difficult to completely remove and unless it is masked with a water-loving substance such as gum arabic, its presence in the background will cause undesirable scumming or ink pick-up.

Conventional water-soluble diazo resins normally require 1 to 2 minutes of exposure to a high intensity light source in order to "burn" in an image. These exposure times, as compared to silver halide films, are long and where time is important, for example in getting out a newspaper, they are a drawback. Exposure times can be reduced by chemical modification of the diazo (cf. U.S. Pat. No. 3,849,392) but this adds to the cost, requires the use of organic solvents for developing on silicated substrates and only incremental gains in time are possible, nothing approaching true film speed.

SUMMARY

The invention provides an aluminum lithographic printing plate having an oleophilic, amplified image and a clean-hydrophilic background which is formed by (a) providing a silicated aluminum substrate having a hydrophilic, anionic, negatively charged surface and a layer on said surface of a light sensitive, cationic, positively charged, water-soluble diazonium material having a multiplicity of reactive sites;

(b) selectively and incompletely exposing the diazonium layer to actinic light for a period of time sufficient to react only a portion of the reactive sites in the exposed area, the resulting light reacted sites being adhered to the substrate;

(c) coupling the diazo layer with an anionic material to reinforce diazo in the exposed areas in situ and remove diazo from the unexposed areas by contacting the substrate after exposure with an anionic material in water in a quantity and for a time sufficient to couple the anionic material with the diazo and dissolve the coupled product from the unexposed areas; and (d) rinsing with water to provide a printing plate having a reinforced, oleophilic image and a clean, hydrophilic background.

The process of the invention for making a lithographic printing plate includes the steps of (a) providing a silicated aluminum substrate having a hydrophilic, anionic, negatively charged surface and a layer on the surface of a light sensitive, cationic, positively charged, water-soluble diazonium material having a multiplicity of reactive sites;

(b) selectively and incompletely exposing the diazonium material to actinic light for a period of time sufficient to react only a portion of the reactive sites whereby the light reacted sites become adhered to the substrate in the exposed area;

(c) coupling the diazo layer with an anionic material to reinforce diazo in the exposed areas in situ and remove diazo from the unexposed areas by contacting the substrate after exposure with an anionic material in water in a quantity and for a time sufficient to couple the anionic material with the diazo and dissolve the coupled product from the unexposed areas; and (d) rinsing with water to provide a printing plate having a reinforced, oleophilic image and a clean, hydrophilic background.

DESCRIPTION

The light sensitivity of lithographic printing plates of the invention using light sensitive multifunctional water-soluble diazonium materials, is greatly improved by an amplification treatment which occurs simultaneously during development of the plate.

In the past, a great deal of effort has been devoted to the amplification of photochemical reactions initiated by the absorption of actinic radiation. Higher sensitivity can be achieved by increasing quantum yields or by amplification. For every photon of incident radiation of specified wavelength that is absorbed by a photochemical material, there is a photochemical reaction which is signaled by either the disappearance or creation of a product. The ratio of this primary process is the quantum yield. For substances such as diazonium salts this ratio is usually one or less than one. To increase the quantum yield such things as deactivators, fluorescence compounds, etc., must be avoided. More fruitful means of doing the same, however, can be achieved by amplification.

Amplification to achieve photographic speed can be done by development in classical silver halide chemistry. The amplification factor is $10^6$. In electrophotography using charge dissipation and subsequent toning, amplification of $10^6$ can be achieved. In photopolymers. the amplification via polymerization after the initial primary process has been initiated is $10^5$. With respect to diazonium materials, however, there is no known amplification technique. This means that the primary process is all that is realized with diazonium materials. There have been some instances where quantum yields in the area of 2 have been achieved (cf. U.S. Pat. No. 3,849,393) but generally a quantum yield approaching 1 is all that is possible. It has been discovered that polyfunctional diazonium materials, that is materials containing two or more light sensitive diazonium groups in the same molecule, can be effectively amplified according to the invention. While not intending to be bound by any particular theory, it is believed that the invention functions in the following manner:

Diazonium salts such as 4-diazo-diphenylamine sulfate, reacted with formaldehyde or paraformaldehyde forms a water soluble polymeric condensation product having a functionality greater than two. This polymeric structure is described in a paper by Ken-ichi Shimazu, *Photography Science and Engineering*, Vol. 17, No. 1, Jan./Feb., 1973. An idealized structure for this material is as follows:

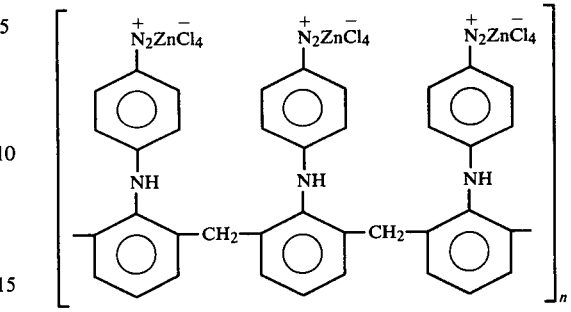

Taking into account the polyfunctionality of this material, upon exposure to actinic radiation, a few diazo groups will absorb photons. Photon absorption destroys diazo groups in a random fashion. Therefore, after incomplete exposure according to the invention (whereby only a portion of the reactive sites are light reacted) it is believed that diazonium material takes on the following configuration:

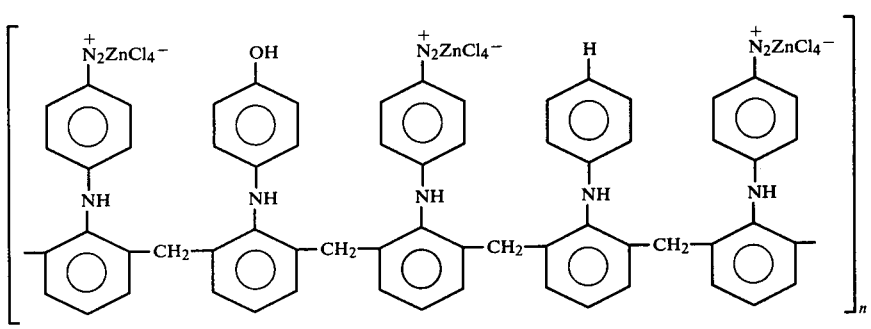

The amplification step of the invention follows exposure to actinic light. Diazonium molecules are very strong cations and react instantaneously with materials of the opposite charge, namely, anionic materials such as surfactants, dyes, polymers and the like. Thus, when an incompletely exposed polyfunctional diazonium material is treated with a developer comprising an anionic surfactant in water, such as sodium lauryl sulfate in water, a coupling reaction between diazonium material and the anionic surfactant takes place. The coupled material produces an oleophilic amplification in the exposed (image) areas while at the same time, in the unexposed background area, the coupling reaction results in simultaneous removal of the light sensitive material. It is believed that there is a two-step sequence, first the coupling reaction between the diazonium material and an anionic material in both the image and non-image (background) areas followed by dissolution of the coupled material from the background. Dissolution does not follow coupling (or amplification) in the image area because prior incomplete exposure to actinic light adheres the light sensitive material to the substrate which prevents dissolution.

Suitable anionic surfactants are water soluble and include the alkali metal salts of alkylaryl sulfonates having 1 to 20 carbon atoms in the alkyl portion and 6 to 14 carbon atoms in the aryl portion, alkali metal salts of alkyl sulfonates having 12 to 20 carbon atoms and ammonium and alkali metal salts of sulfated higher fatty alcohols having 10 to 20 carbon atoms. Anionic materials used in the invention are dissolved in water and the concentration of the anionic material is sufficient to dissolve the coupled reaction product between the diazonium and anionic materials without, however, being so high as to exceed the solubility product that would otherwise cause precipitation.

Specific examples of anionic surfactants are given herein together with a test to determine suitability. The effectiveness of certain anionic surfactants can be improved by adjusting the PH in the range of 2–10, preferably 2.5–9. While a PH adjuster can be present, the presence of other materials such as cationic materials that will interfere with or prevent the coupling reaction between the diazonium layer and the anionic material in both the image (exposed) and non-image areas and dissolution of the coupled material from the non-image areas, must be avoided. If a lacquer is used to prepare a plate for the press, it should not contain solvents such as a mixture of toluene and isopropyl alcohol or dimethylformamid that are capable of dissolving the coupled product off the plate in the image area.

As described in copending application Ser. No. 85,145, filed Oct. 12, 1979, now U.S. Pat. No. 4,277,555 issued July 7, 1981, cationic dyes can be applied to the anionically charged substrate or incorporated in the diazonium material to provide a visible image on the plate. Suitable dyes include basic cationic dyes such as Victoria Green, Rhodamine B, Rhodamine 5GLD, crystal violet, extra pure APN, Paper Blue R and the like.

Cationic light sensitive materials used in the invention are water soluble diazonium materials having at least two reactive sites per molecule with each reactive site being capable of being chemically altered by light or chemically reacted with an anionic material. For example, 4-diazo diphenylamine condensed with a carbonyl compound such as formaldehyde has the needed multiplicity of reactive sites each having the required dual functionality. Such a condensed diazo compound further coupled with an aromatic compound such as the sulphonic acid of benzophenone to make it water insoluble is only light sensitive and cannot undergo chemical amplification according to the invention. Suitable diazonium compounds are described, inter alia, in U.S. Pat. No. 2,063,631, 2,667,415, 2,679,498, 3,050,502, 3,311,605, 3,163,633, 3,406,159, and 3,227,074.

The silicated aluminum substrate can be a single sheet or a laminate, rigid or flexible. The preferred lithographic substrate is anodized aluminum which may be pretreated before anodizing to roughen or grain the surface, for example using mechanical, chemical or electrochemical techniques as are well known in the art and it may be post-treated after anodizing. It is preferred to impart hydrophilicity and anionic charge by silicating anodized aluminum as described in Fromson U.S. Pat. No. 3,181,461 or by silicating as described in Jewett et al. U.S. Pat. No. 2,714,066. The term "silicated aluminum" is thus used herein to describe silicated aluminum as per U.S. Pat. No. 2,714,066 and silicated anodized aluminum as per U.S. Pat. No. 3,181,461.

After treatment with the anionic material, the image can be reinforced with an oleophilic UV curable material which can be coated on and then cured. This is described in co-pending application Ser. No. 972,561, filed Dec. 22, 1978, now U.S. Pat. Nos. 4,334,769, issued June 15, 1982, and 4,338,007, issued July 6, 1982, which are incorporated herein by way of reference.

Suitable UV curable materials are commercially available from a number of sources in the form of UV curable inks, coatings, oligomers and monomers. Such commercially available materials can be obtained from the following companies: Inmont Corporation, Sinclair & Valentine, Celanese Chemical Company, 3-M Company, Desoto Chemical Company, Polymer Industries, Shell Chemical, Mobile Chemical, W. R. Grace, Design Coat Company, and Ware Chemical Corporation.

UV curable materials including monomers and oligomers are described in the following patents:

U.S. Pat. No. 3,297,745, 1967
U.S. Pat. No. 3,380,381, 1968
U.S. Pat. No. 3,673,140, 1972
U.S. Pat. No. 3,770,643, 1972
U.S. Pat. No. 3,712,871, 1973
U.S. Pat. No. 3,804,736, 1974

There are also materials that will cure upon exposure to other sources of radiation, for example an electron beam. These curable materials can be used in special applications in place of the UV material and are commercially available. Electron beam curable compositions are described in U.S. Pat. No. 3,586,526, 1971.

Chemical amplification after exposure to actinic radiation according to the invention makes it possible to substantially reduce normal exposure times associated with diazonium compounds. This can be expressed empirically as simply the amount of actinic light necessary to produce an image capable of running on a lithographic press. Chemical amplification according to the invention makes it possible to reduce the amount of light needed to attain this by a factor of from 2 to 10 or more. This means that a diazo sensitized plate that normally required 1 or 2 minutes to image can now be imaged in a matter of seconds. The amount of diazo on the plate can also be reduced.

The amount of light necessary to produce an image capable of running on a lithographic press can also be expressed in terms of millijoules per square centimeter. In carrying out the invention the amount of actinic light can be from less than 100 to as little as 5 millijoules/$cm^2$ at UV wave lengths of 300–400 nanometers. This means that plates of the invention can be imaged with lasers such as are marketed by EOCOM, Inc.

The invention thus greatly improves the photoresponse of lithographic printing plates to a point approaching projection speed while using conventional, water-soluble diazonium materials. Exposure times can be reduced to 1 to 10 seconds under conventional conditions whereas prior techniques using the same conditions required 60 or more seconds. Therefore, lithographic plates according to the invention an be imaged using lasers, with a projection size negative or with contact size negative. Plates can also be made with continuous tone images using a negative without the customary screen.

After treatment with the anionic material the developed amplified image can be blanket exposed to actinic light to photo react any remaining light sensitive sites in the image area. This includes coupled diazonium and anionic materials which remain light sensitive after coupling.

A test to determine whether a particular anionic material is suitable is as follows:

A 5% aqueous solution of the anionic material is prepared. An aluminum lithographic plate grained, anodized, and silicated is coated with a 1% solution of a light sensitive, water-soluble, diazo condensation product (such as Fairmont's Chemical Diazo #4). The coated plate is exposed to a Stouffer Graphic Arts Guide for a relatively short period of time—5 to 10 seconds. The exposed plate is immersed in the 5% solution of anionic material for 10 seconds. The plate is then rinsed and lacquered with a standard lithographic lacquer (such as Fairmont's Black Lacquer). Another plate, identically prepared and exposed, is treated with the Black Lacquer only. This is the control. The two plates are compared. If the anionic material is effective, the post-treated plate will show significant difference in light sensitivity versus the control.

Many different salts of anionic materials are suitable: these include sodium, lithium, ammonium, or triethanol amine salts and the like. Examples of suitable anionic surfactants (and their commercial source) are as follows:

1. Sodium lauryl sulfate (Procter & Gamble, Equex S. Equex SP; Alcolac, Inc. Sipex SB).
2. Ammonium lauryl sulfate (Alcolac. Inc., Sipon L-22).
3. Sodium lauryl ether sulfate (Alcolac, Inc., Sipon ES).
4. Sodium dodecyl benzene sulfonate (Alcolac, Inc. Siponate DS-XO).
5. Ammonium lauryl ether sulfonate (Alcolac, Inc. Sipon EA).
6. Triethanolamine lauryl sulfate (Alcolac, Inc. Sipon LT-6).
7. Sodium alkyl sulfate (Alcolac, Inc., Sipex OLS).
8. Sodium stearate (Emery Inds.).
9. Sodium palmitate (Emery Inds.).
10. Sodium oleate (Matlerson, Coleman & Bell).
11. Dioctyl sodium sulfosuccinate (Cyanamid, Aerosol OT).
12. Tetrasodium N-Cl, 2dicarboxyethyl 1)-N-octadecyl sulfosuccinate (Cyanamid, Aerosol 22).
13. Sodium Xylene sulfonate (Witco Chemical, Ultra SXS).
14. Sodium toluene sulfonate (Witco Chemical, Ultra STS).
15. Sodium cumene sulfonate (Witco Chemical, Ultra SCS hydrotrope).
16. Sodium dihexyl sulfosuccinate (Cyanamide Aerosol Ay-65).
17. Sodium diaml sulfosuccinate (Cyanamide Aerosol Ay-65).
18. Anionic phosphate surfactant (Rohm & Haas Co., Triton QS-30).
19. Sodium alkylaryl polyether sulfate (Rohm & Haas Co., Triton W-30 Conc.).
20. Phosphate surfactant, potassium salt (Rohm & Haas Co., Triton H-66).
21. Sodium alkylaryl polyether sulfonate (Rohm & Haas Co., Triton X-200).

Sodium lauryl sulfate is preferred because of its availability and cost.

EXAMPLE 1 (control)

This example illustrates the normal photo-responsee of water soluble diazo resins.

A 1% solution of the formaldehyde condensation product of a diphenylamine-4-diazonium zinc chloride double salt (Fairmont Diazo Resin #4) is prepared in water. The solution is placed in a two roll coating machine. A brushed grained, anodized and silicated plate, 10×16×0.12 (Ano-Coil Delta Plate) is coated face down through the machine. The coated plate is dried and placed in a Nu Arc Plate Maker exposure unit, 24 inches from the source (4 kw lamp). A Stouffer Graphic Arts Step scale is step exposed on the plate for the following times: 1 second, 5 seconds, 10 seconds, 15 seconds, 30 seconds, and 60 seconds. The exposed plate is then developed with Fairmont's black lacquer for wipe-on plates. After development, rinsing, and drying the solid step exposure level is read for each exposure time: 1 second–no image, 5 seconds–no image, 10 seconds–a ghost image, 15 seconds–a solid 1, 30 seconds–a solid 3, and 60 seconds–a solid 5. A solid 5 is generally considered the minimum level of photo-response required for normal lithographic printing.

EXAMPLE 2

This example illustrates the increase in photo-response according to the invention.

An aluminum lithographic plate, similar to Example 1, is coated and exposed for the same time sequences as in Example 1. The exposed plate is then totally immersed, 5 seconds, in a 5% solution of sodium lauryl sulfate in water, rinsed and developed with Fairmont's black wipe-on lacquer which contains cyclolexanone, a solvent that will not dissolve the coupled product off the plate in the image area. The same 5% aqueous solution of anionic material is used in the examples herein unless indicated otherwise. The solid step exposure reading for each exposure time is as follows: 1 second–solid 2, 5 seconds–solid 6, 10 seconds–a solid 8, 15 seconds–a solid 10, 30 seconds–a solid 12, and 60 seconds–a solid 14. This demonstrates that amplification with sodium lauryl sulfate produces a 9-step improvement in photo-response.

EXAMPLE 3

An aluminum lithographic plate is coated and exposed as in Example 1. The plate is developed in a 5% solution of sodium lauryl sulfate, rinsed, dried, and re-exposed (blanket) for 1½ minutes. The re-exposed plate is then rubbed with a cotton pad saturated with toluene/alcohol rinsed and lacquered with black Fairmont lacquer. The observed photo-response is similar to Example 2. This example demonstrates that in situ formation of the coupled product after exposure greatly improves photo-response.

EXAMPLE 4

An aluminum lithograph plate is coated and exposed as in Example 1. The exposed plate is then immersed in 5% sodium lauryl sulfate for 5 seconds, rinsed, and inked with black offset press ink. The observed photo-response is: 1 second–a solid 2, 5 seconds–a solid 5, 10 seconds–a solid 7–8, 15 seconds–a solid 9, 30 seconds–a solid 11, and 60 seconds–a solid 13. A solid 5 is obtained in five seconds as compared to the 60 second exposure of Example 1, a 12-fold decrease in the exposure time.

EXAMPLE 5

An aluminum lithographic plate similar to Example 1 is exposed and processed as in Example 2 except that an Ultra Violet sensitive emulsion of the following composition is used in place of the Fairmont lacquer.

A 30 grms Inmont UV Blue Ink
12.5 cc Span 80 (I.C.I.)

120 mls. Cellosolve Acetate

B 250 mils 8° Be Gum Arabic
12.5 grms Pluronic F38 (BASF)

Mix by adding B to A while stirring. The emulsion can be applied with sponge, cloth, or brush. After treatment with the UV emulsion the plate is re-exposed in a high intensity UV processor such as a PPG industries, Model PC2502A at 25 ft/minute. The photo-response is similar to Example 2 but the toughness and abrasion resistance of the image is much improved.

EXAMPLE 6

A brush grained, anodized silicated aluminum plate (Alloy 1100) is immersed in dye bath of a 1% solution of a basic (cationic) dye such as DuPont's Victoria Green Liquid, Rhodamine B Liquid, Rhodamine 5 GLD, crystal violet extra pure APN or Paper Blue R Liquid. The dyes plate is then coated as in Example 1 and exposed in a 4 kw Nu-Arc flip-top exposure until for 5 seconds to a newspaper page negative. The exposed, dyed plate is immersed in a 5% solution of sodium lauryl sulfate. Immediately upon removal from the bath, a strong visible image is seen on the plate corresponding to the exposed areas whereas the anionic sulfate not only couples with the background diazo but also removes the cationic dye from the background.

EXAMPLE 7

A brushed grained, silicated, and anodized plate (Ano-Coil's Delta Plate) is coated with a 1% diazo coating (Fairmont Resin #4) containing ½% Victoria Green Liquid dye (DuPont). The plate is dried and exposed for 5 seconds on a Nu-Arc as in Example 6. The plate is developed with a 5% solution of ammoniun lauryl sulfate using a sponge, whereupon a visible image becomes immediately apparent. The background diazo and cationic dye are removed as in Example 6. It is preferred to overwhelm the exposed surface with aqueous anionic material to couple the entire diazo layer and dissolve the coupled product from the unexposed areas of the plate. This can be accomplished by immersion in the aqueous solution or by flooding the exposed surface by cascading or spraying. Rubbing by hand, normally employed with conventional developers is not necessary and should be avoided to prevent the creation of conditions under which the coupled product will come out of solution in the developer and deposit in the background. Uneven hand pressure can lead to this whereas uniform machine pressure applied via sponges or brushed can be tolerated.

EXAMPLE 8

An anodized and silicated aluminum plate (Ano-Coil's Delta plate) is dyed in a 1% solution of Victoria Green Liquid. The plate is coated with a 1% solution of Fairmont diazo resin #4, exposed to a newspaper negative for 10 seconds and immersed in a 5% solution of sodium lauryl sulfate. Immediately an image becomes visible. The background is cleaned as in Example 6. The plate is rinsed in tap water and dried. The plate is placed on a Goss Metro Press and 50,000 good images are obtained.

EXAMPLE 9

A plate is prepared as in Example 7 but after development it is rubbed with a UV curable emulsion (Example 5) rinsed, dried, and re-exposed through a P.P.G. UV processor at 25 ft./minute. The plate is placed on a Goss Metro newspaper press and 250,000 impressions are obtained.

EXAMPLE 10

A brush grained, anodized, silicated, aluminum plate is coated with a 1% solution of water soluble, polyfunctional diazo resin (Fairmont's diazo resin #4) and dried. The sensitized plate is then placed in an Eocom Laserite Platemaker and scanned with an ion argon laser. A scanning time of 1 minute is necessary to scan a plate approximately $23 \times 14$. The approximate laser power at the plate surface is 8 mj/cm$^2$. After scanning, the plate is developed with a 5% solution of sodium lauryl sulfate. The plate was then rubbed with black press ink producing a strong quality image. A step wedge scanned onto the plate showed 7 total steps with a solid 5 steps.

EXAMPLE 11

A plate was coated, laser exposed and developed as in Example 11 using 10 mj/cm$^2$ laser power. This time after development, the plate was rubbed with a UV curable emulsion described in Example 5. The thus treated plate was then exposed in a P.P.G. processor at 25 ft./minute. A tough durable image results. A scanned Stouffer Step Guide showed 9 total steps with a solid 5.

EXAMPLE 12

A plate as described in Example 10 was dyed with a cationic water soluble dye, 1% Victoria Green (DuPont). The plate was coated with a 1% solution of diazo resin and dried. This plate was laser exposed as in Example 10 with laser power of 4 mj/cm$^2$.

After exposure to the laser, the plate is developed by hand with sodium lauryl sulfate (5% solution). The thus treated plate is then lacquered with a black lacquer from Western Litho Company (Jet Black). A dense black image results.

EXAMPLE 13

A brush grained, anodized, silicated plate is coated with a 3% solution of a water soluble light-sensitive diazo (Fairmount's Diazo #4). The thus sensitized plate is exposed and processed as in Example 2. The results are similar showing significant speed increases over conventionally processed plates.

EXAMPLE 14

This example demonstrates the importance of using polyfunctional diazo compounds opposed to monoazo compounds. An aluminum plate similar to Example 2 is sensitized with the monoazo molecule paradiazo diphenylamine sulfate. The plate is exposed on a Nu-Arc for 1 second, 5 seconds, 10 seconds, 15 seconds, 30 seconds, and 60 seconds through a Stouffer Step Guide. The exposed plate is then immersed in a 5% solution of sodium lauryl sulfate for 5 seconds, rinsed and lacquered with Fairmont's black lacquer. Result: 1 second–no image, 2 seconds–no image, 5 seconds–no image, 10 seconds–no image, 15 seconds–ghost image, 30 seconds–step 1, 60 seconds–step 2. Compare this photoresponse with the data in Example 2.

EXAMPLE 15

A plate is prepared as in Example 14 only this time it is lacquered only without immersion in sodium lauryl sulfate. A slight improvment only over Example 14 results.

What is claimed is:

1. Process for making an aluminum lithographic printing plate which comprises:
   (a) providing a silicated aluminum substrate having a hydrophilic, anionic, negatively charged surface and a layer on said surface of a light sensitive, cationic, positively charged, water soluble diazo material having at least two reactive sites per molecule, each reactive site being capable of chemical alteration by actinic light or chemical reaction with an anionic material;
   (b) selectively and incompletely exposing the diazo layer to actinic light to alter only a portion of the reactive sites, thereby adhering the diazo material to the substrate in the exposed areas;
   (c) removing unexposed diazo by contacting the plate after exposure with a solution consisting essentially of an anionic material in water in a quantity and for a time sufficient to couple the diazo with the anionic material and dissolve the coupled product from the non-image area; and
   (d) rinsing with water to provide a printing plate having a reinforced, oleophilic image and a clean, hydrophilic background.

2. Process of claim 1 wherein the anionic material is a surfactant selected from the group of alkali metal salts of alkylaryl sulfonates, alkali metal salts of alkyl sulfonates and alkali metal ammonium salts of sulfated higher fatty alcohols.

3. Process of claim 1 wherein the exposed areas, after treatment with said anionic material, are reinforced with a UV-curable material.

4. Process of claim 1 wherein the substrate is blanket exposed to actinic light after the treatment with the anionic material.

5. Process of claim 1 wherein the substrate is aluminum treated with an alkali metal silicate.

6. Process of claim 1 wherein the substrate is anodized aluminum treated with an alkali metal silicate.

7. Process of claim 5 or 6 wherein the treated substrate is colored with a cationic dye.

8. Process of claim 5 or 6 wherein the aluminum is grained before treatment.

9. Process of claim 1 wherein the amount of actinic light necessary to produce an image capable of running on a lithographic press is reduced by a factor of from 2 to 10.

10. Process of claim 1 wherein the amount of actinic light necessary to produce an image capable of running on a lithographic press is less than about 100 millijoules/cm$^2$ at UV wave lengths of 300–400 nanometers.

* * * * *